(12) United States Patent
Lin

(10) Patent No.: US 9,281,034 B2
(45) Date of Patent: Mar. 8, 2016

(54) DATA STROBE GENERATION

(71) Applicant: Cavium, Inc., San Jose, CA (US)

(72) Inventor: David Lin, Westborough, MA (US)

(73) Assignee: Cavium, Inc., San Jose, CA (US)

( * ) Notice: Subject to any disclaimer, the term of this patent is extended or adjusted under 35 U.S.C. 154(b) by 0 days.

(21) Appl. No.: 14/045,644

(22) Filed: Oct. 3, 2013

(65) Prior Publication Data

US 2015/0098277 A1    Apr. 9, 2015

(51) Int. Cl.
*G11C 8/12* (2006.01)
*G11C 7/22* (2006.01)

(52) U.S. Cl.
CPC .......... *G11C 7/222* (2013.01); *G11C 2207/105* (2013.01)

(58) Field of Classification Search
USPC ...................................... 365/189.02, 193, 194
See application file for complete search history.

(56) References Cited

U.S. PATENT DOCUMENTS

| | | | |
|---|---|---|---|
| 5,930,231 A | 7/1999 | Miller et al. | |
| 6,114,914 A | 9/2000 | Mar | |
| 6,131,168 A | 10/2000 | Krzyzkowski | |
| 6,791,889 B2 * | 9/2004 | Peterson | 365/193 |
| 6,952,462 B2 | 10/2005 | Harrison | |
| 7,012,985 B1 | 3/2006 | Nix | |
| 7,103,790 B2 * | 9/2006 | Rentschler et al. | 713/401 |
| 7,157,889 B2 | 1/2007 | Kernahan et al. | |
| 7,276,952 B2 | 10/2007 | Desai et al. | |
| 7,304,897 B2 * | 12/2007 | Hong | G06F 13/1684 365/189.02 |
| 7,561,477 B2 * | 7/2009 | Morzano et al. | 365/189.05 |
| 7,915,938 B2 | 3/2011 | Iozsef et al. | |
| 8,917,129 B1 | 12/2014 | He et al. | |
| 2002/0071509 A1 | 6/2002 | Richards et al. | |
| 2003/0053572 A1 | 3/2003 | Brethour et al. | |
| 2005/0285652 A1 | 12/2005 | Panikkar et al. | |
| 2006/0245519 A1 | 11/2006 | Cheng et al. | |
| 2007/0217559 A1 | 9/2007 | Stott et al. | |
| 2009/0059642 A1 * | 3/2009 | Ware et al. | 365/63 |
| 2010/0225369 A1 | 9/2010 | Badaroglu | |
| 2010/0246290 A1 * | 9/2010 | MacLaren et al. | 365/193 |
| 2011/0096613 A1 * | 4/2011 | Teramoto | G11C 7/02 365/193 |
| 2011/0148486 A1 | 6/2011 | Mosalikanti et al. | |
| 2012/0206181 A1 * | 8/2012 | Lin | H03K 5/135 327/199 |
| 2012/0319749 A1 | 12/2012 | Thaller et al. | |
| 2013/0033946 A1 | 2/2013 | Ware et al. | |
| 2014/0293710 A1 | 10/2014 | Ware et al. | |
| 2015/0188528 A1 | 7/2015 | Lin et al. | |

* cited by examiner

*Primary Examiner* — Hoai V Ho
*Assistant Examiner* — Minh Dinh
(74) *Attorney, Agent, or Firm* — Hamilton, Brook, Smith & Reynolds, P.C.

(57) ABSTRACT

In an embodiment, a method of generating strobe signals includes generating a first strobe signal in a first mode by operating a multiplexer with a clock signal to select between a first input signal and a second input signal, the first input signal having a static first signal level and the second input signal corresponding to a control signal. In a second mode, the method includes generating a second strobe signal by operating the multiplexer with the clock signal to select between the first input signal and the second input signal, the first input signal corresponding to the control signal inverted and delayed and the second input signal having a static second signal level.

16 Claims, 9 Drawing Sheets

DATA STROBE GENERATION

BACKGROUND

Double data rate synchronous dynamic random-access memory (DDR SDRAM) is a class of memory which has evolved generation over generation every 3-5 years. For the generations of DDR1, DDR2, and DDR3, the input/output (I/O) interface specification is based on Stub Series Terminated Logic (SSTL) I/O electrical standards. For DDR4, the I/O specification is based on Pseudo Open Drain (POD). Other than speed improvement and voltage reduction, a main difference between the two specifications is the termination voltage. For SSTL I/O, the terminated voltage is at the half rail between power and ground, or VDD_IO/2; for POD I/O, the terminated voltage is at the power rail, or VDD_IO. Due to the change of terminated voltage, the specification of strobe signals (referred to as DQS strobe) has also changed.

SUMMARY

Embodiments of the invention relate to data strobe generation at a memory interface during write transactions. To support two different memory protocols (e.g., DDR3 and DDR4 technologies) at the same memory controller, novel circuitry is presented to simplify the overhead imposed on the support of the two different memory protocols. The present approach offloads the burden from the memory controller and employs circuitry incorporated into a memory input/output interface to address different waveform requirements for DDR3 and DDR4. In addition, the circuitry may also take care of delay push-out for write leveling without any phase-shifting from the memory controller. The controller need only provide the same input waveform to the memory input/output interface.

In an embodiment, a method of generating strobe signals includes generating a first strobe signal in a first mode by operating a multiplexer with a clock signal to select between a first input signal and a second input signal, the first input signal having a static first signal level and the second input signal corresponding to a control signal; and generating a second strobe signal in a second mode by operating the multiplexer with the clock signal to select between the first input signal and the second input signal, the first input signal corresponding to the control signal inverted and delayed and the second input signal having a static second signal level. In an embodiment, the first mode may correspond to a DDR3 memory circuit and the second mode may correspond to a DDR4 memory circuit.

Write leveling may be applied to the control signal prior to generating the first strobe signal in the first mode.

Write leveling may be applied to the control signal inverted and delayed prior to generating the second strobe signal in the second mode.

In another embodiment, a strobe generation circuit includes a first stage having a multiplexer configured in a first mode to select a control signal and configured in a second mode to select the control signal inverted and delayed. An other stage is coupled to the first stage, the other stage having a multiplexer configured to select in the first mode between a first input signal and a second input signal, the first input signal having a static first signal level and the second input signal corresponding to the control signal, to generate a first strobe signal. The multiplexer of the other stage is further configured to select in the second mode between the first input signal and the second input signal, the first input signal corresponding to the control signal inverted and delayed and the second input signal having a static second signal level, to generate a second strobe signal. In addition, this stage may be configured to provide further time shifting needed for different write leveling operation.

In an embodiment of the strobe generation circuit, the first mode corresponds to a DDR3 memory circuit and the second mode corresponds to a DDR4 memory circuit.

The strobe generation circuit may further include a second stage coupled between the first stage and the other stage, the second stage configured to apply write leveling to the control signal prior to generating the first strobe signal in the first mode and to apply write leveling to the control signal inverted and delayed prior to generating the second strobe signal in the second mode.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

DETAILED DESCRIPTION

A description of example embodiments of the invention follows.

Due to the change of terminated voltage between DDR4 and earlier DDR generations, the specification of strobe signals (referred to as DQS strobe) has also changed. In DDR3, the DQS strobe signal when driven from the memory controller needs to transition high for a half cycle and low for another half cycle as preamble (shown in FIG. 1) and followed by either two clock cycles worth of pulses for burst length (BL)=4, or four clock cycles worth of pulses for BL=8. For simplicity, the waveforms shown are based on BL=4. In DDR4, the specification requires the memory controller to stay high for a half cycle and transition low for another half cycle as a preamble. As the DQS strobe is not being driven by the controller shortly before the preamble or after the last DQS pulse in a write transaction, the DQS level is don't care in DDR3, but it needs to stay high in DDR4. As DQS strobes are differential signals, the solid waveforms are shown to represent DQS_P, and the dashed waveforms are shown to represent DQS_N.

Due to these waveform differences in the requirements, the memory controller side needs to change accordingly. More-over, as the technology shift from DDR3 to DDR4 is widely dependent on market trends, SDRAM availability and pricing, controller vendors usually need to have the flexibility to support both DDR3 and DDR4 at the same time.

Figure 1:
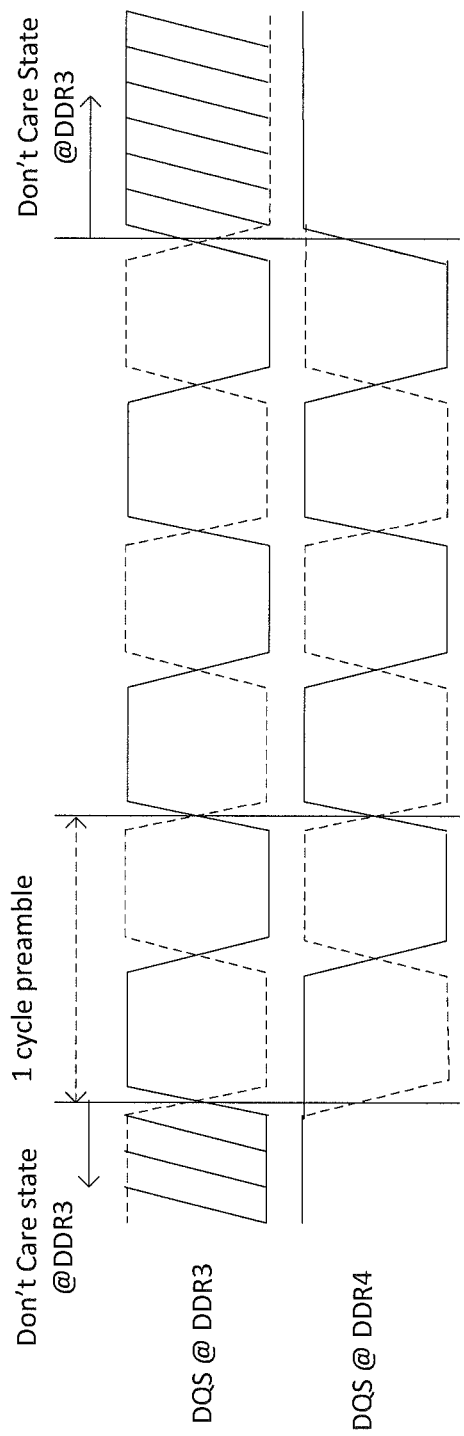
FIG. 1 is a timing diagram that illustrates DDR3 and DDR4 DQS strobe waveforms during a write operation.
Figure 2:
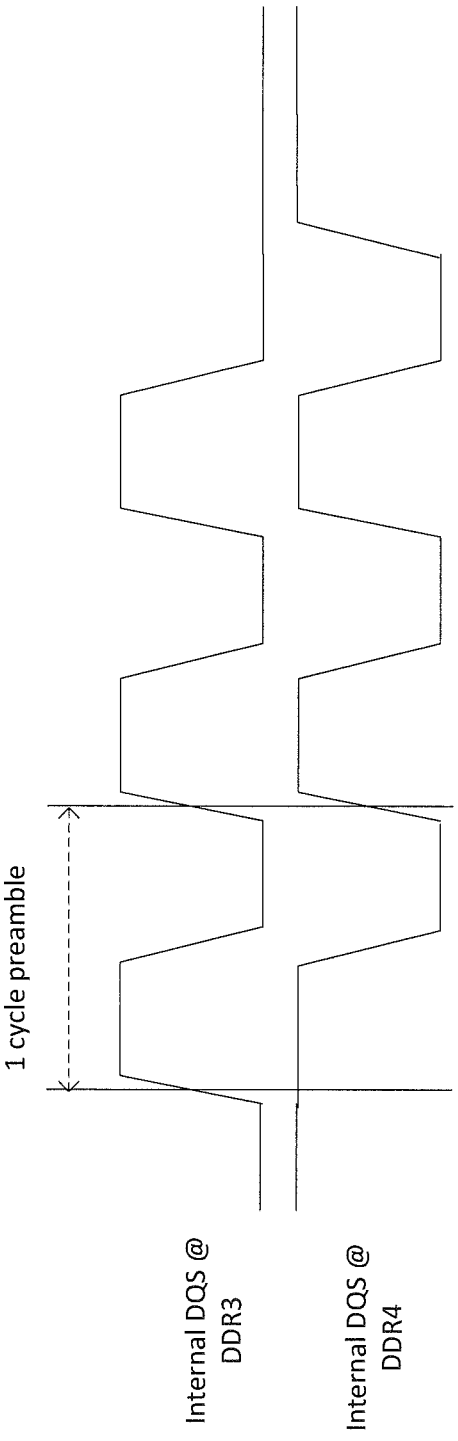
FIG. 2 is a timing diagram that illustrates DDR3 and DDR4 DQS strobe waveforms inside a typical memory controller.
Figure 3:
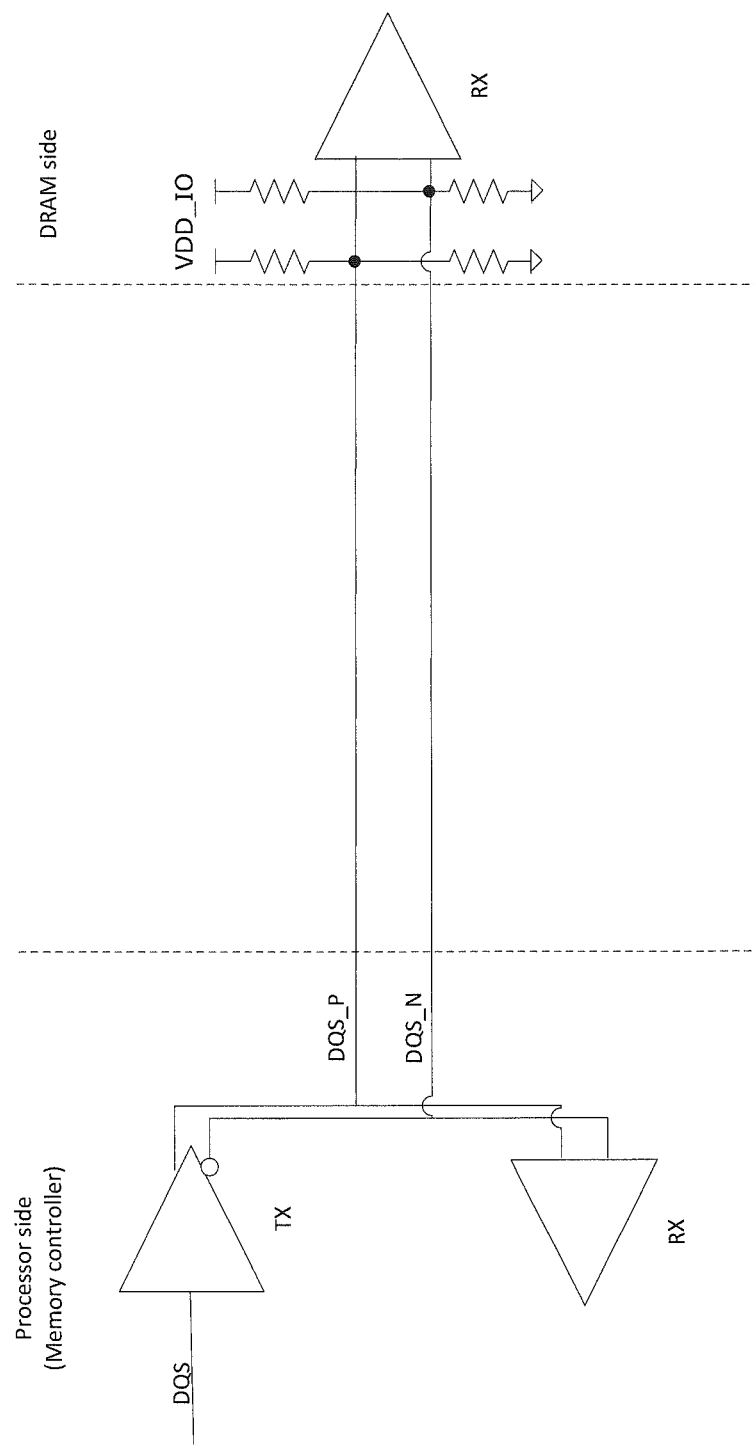
FIG. 3 is a circuit diagram that illustrates an example DDR3 system during a write operation.
Figure 4:
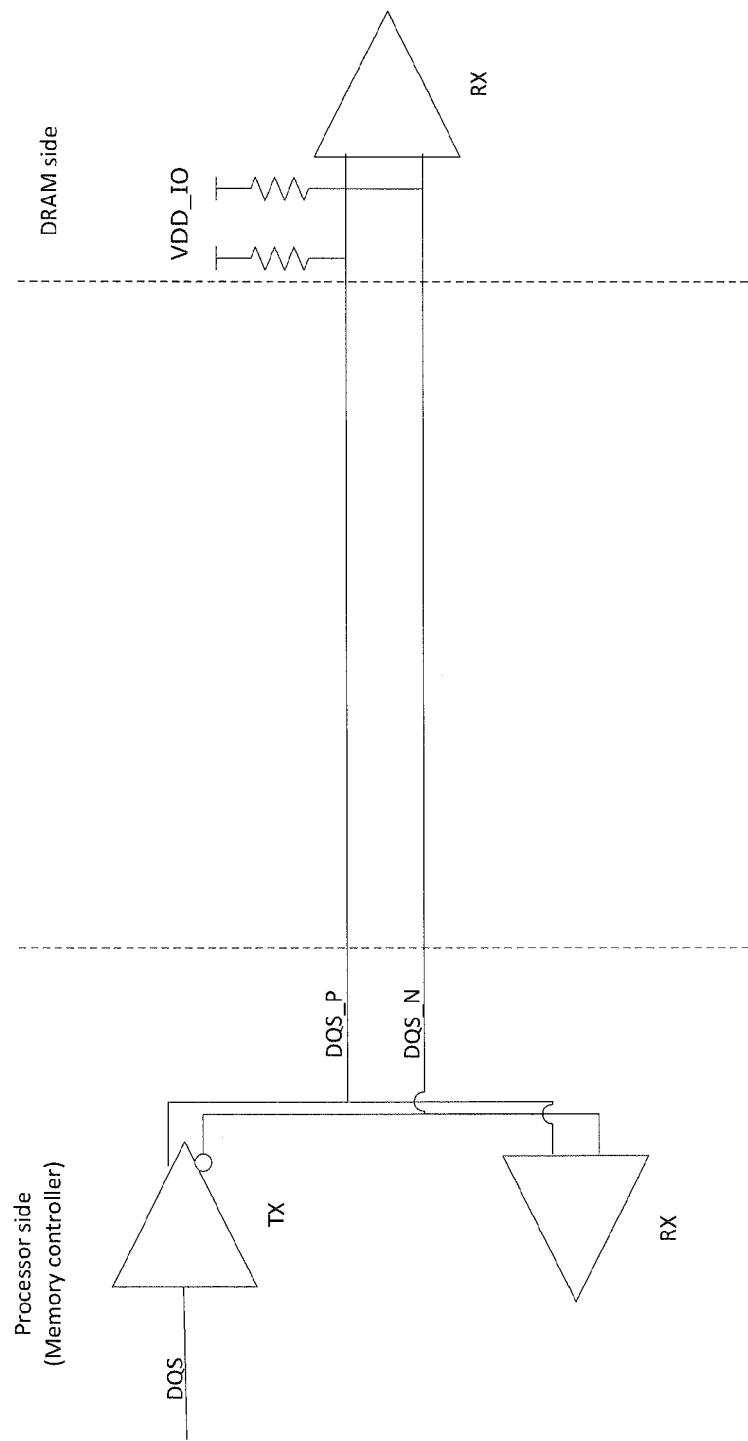
FIG. 4 is a circuit diagram that illustrates an example DDR4 system during a write operation.

FIG. 1 shows the waveform requirement at the pin outs of the typical memory controller. Internally before the differential transmitters of DQS strobe, the DQS strobe can be as shown in FIG. 2, for DDR3 and DDR4 respectively. Conventionally in DDR3, transmitters can be tri-stated at a don't care state, so it does not matter what is really being driven before the transmitters during that time. In addition, at the non-driven state, the voltage level at the bus is mainly affected by the termination voltage at the DRAM side if termination is used. For the DDR3 waveform, since a low to high transition is required to produce a preamble and a don't care state after the final low state, it is natural to assume that DQS starts with a logic low and ends with a logic low inside the memory controller. A typical DDR3 system during write is shown in FIG. 3. Note that the termination at the DRAM side is VDD_IO/2 on both DQS_P and DQS_N. For DDR4 waveforms, since the specification requires a logic high state before the preamble and logic high state after the last clock pulse, the DRAM and memory controller have to work together to achieve this requirement. At the DRAM side, the termination to VDD will be activated, while the memory controller will also keep at logic high internally at the non-driven state to avoid a sudden switch between non-driven to driven or driven to non-driven state transitions. The system configuration for DDR4 is shown in FIG. 4. Note that the termination at the DRAM side is to VDD_IO on both DQS_P and DQS_N.

From the preceding discussion it is clear that the conventional memory controller has to be able to generate two different waveforms for DDR3 and DDR4 depending on which technology it is trying to support at a given time. This creates design complexity at the memory controller. Two sets of logic may be required to produce two different waveforms to support DDR3 and DDR4. Another approach may be to take the waveform required for DDR3, inverting and phase-shifting or delaying the waveform by a half cycle to generate the waveform required for DDR4. However, timing for the inversion and half-cycle phase shift or delay has to be done without introducing additional insertion delay other than exactly 180 degrees, or a half cycle, off its original source from the DDR3 waveform.

Embodiments of the present invention provide circuitry that can simplify the waveform generated from the memory controller. With the present approach, the controller only needs to produce the same output waveform regardless of whether it needs to support DDR3 or DDR4. In an example embodiment, the inventive circuitry at the I/O interface generates the appropriate waveforms depending on a "ddr4_mode" control signal. For example, when ddr4_mode is de-asserted at logic 0 state, the I/O interface generates a DQS strobe signal that conforms with the DDR3 specification; when ddr4_mode is asserted to logic 1, the interface produces a DQS strobe that conforms with the DDR4 specification.

Figure 5:
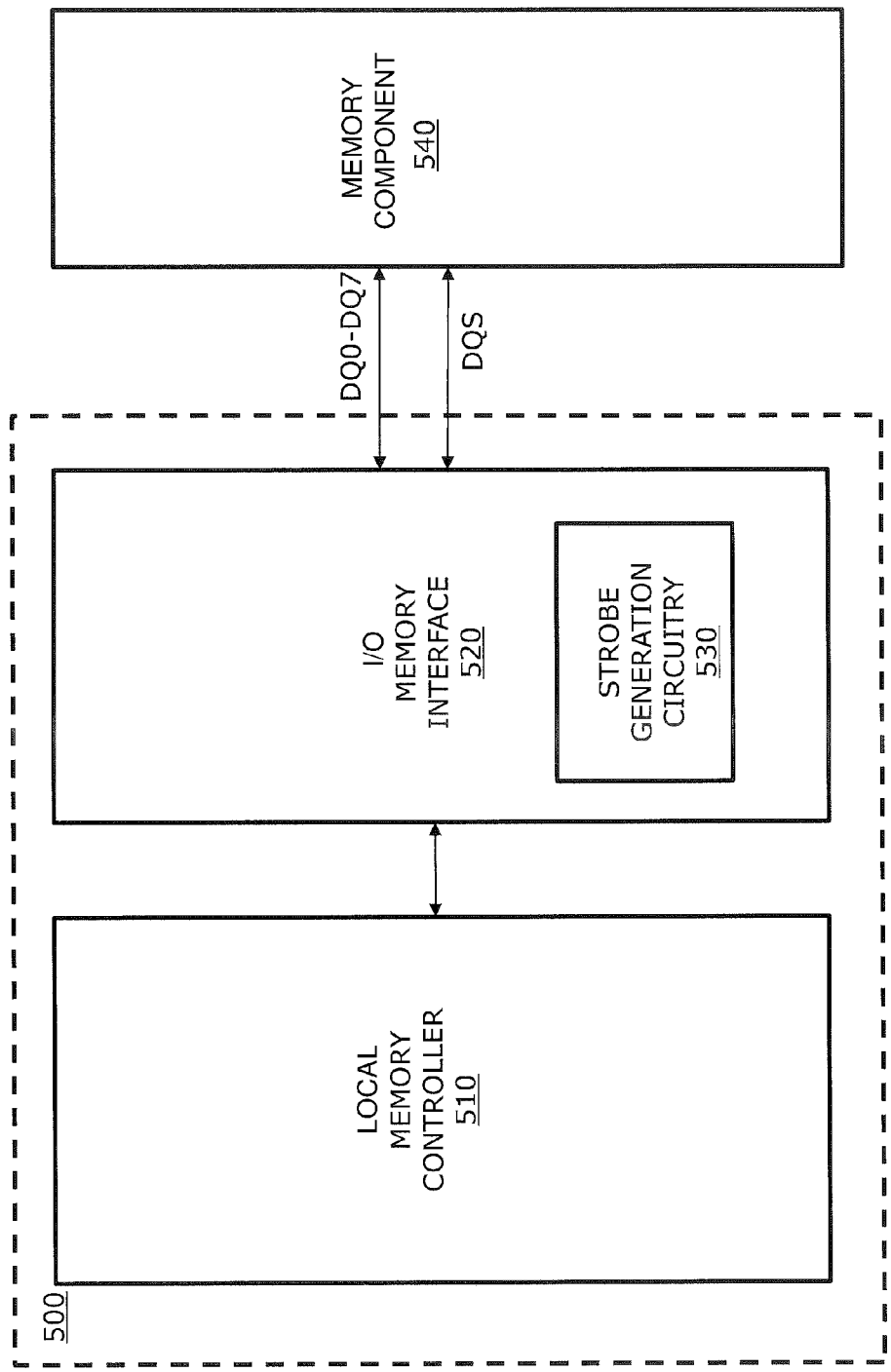
FIG. 5 is a block diagram illustrating an overview of a memory system according to at least one example embodiment.

FIG. 5 is a block diagram illustrating an overview of a memory system according to at least one example embodiment. The memory system includes a memory controller device 500 and a memory component 540. The memory controller device 500 is typically implemented within a microprocessor. In response to a read operation, the memory component 540 outputs to the memory controller device 500 eight data signals, also referred to as DQ signals, representing eight bits of a data byte, and at least one pair of data strobe signals, also referred to as DQS signals. Likewise, in response to a write operation, the memory component 540 inputs eight DQ data signals and at least one pair of DQS data strobe signals from the memory controller device 500. The memory controller device 500 includes a local memory controller (LMC) 510 and a bidirectional input/output memory interface 520. The input/output memory interface 520 is a bidirectional I/O interface for sending data, in both directions, between the memory component 540 and the LMC 510. The I/O memory interface 520 includes eight single-ended receivers and eight single-ended transmitters for a given byte. The I/O memory interface 520 communicates with an on-chip memory, e.g., level-2 cache (L2C), of the microprocessor through the LMC 510.

The I/O memory interface 520 also includes strobe generation circuitry 530 for generating DQS signals for the write operation towards the memory component 540.

Figure 6:
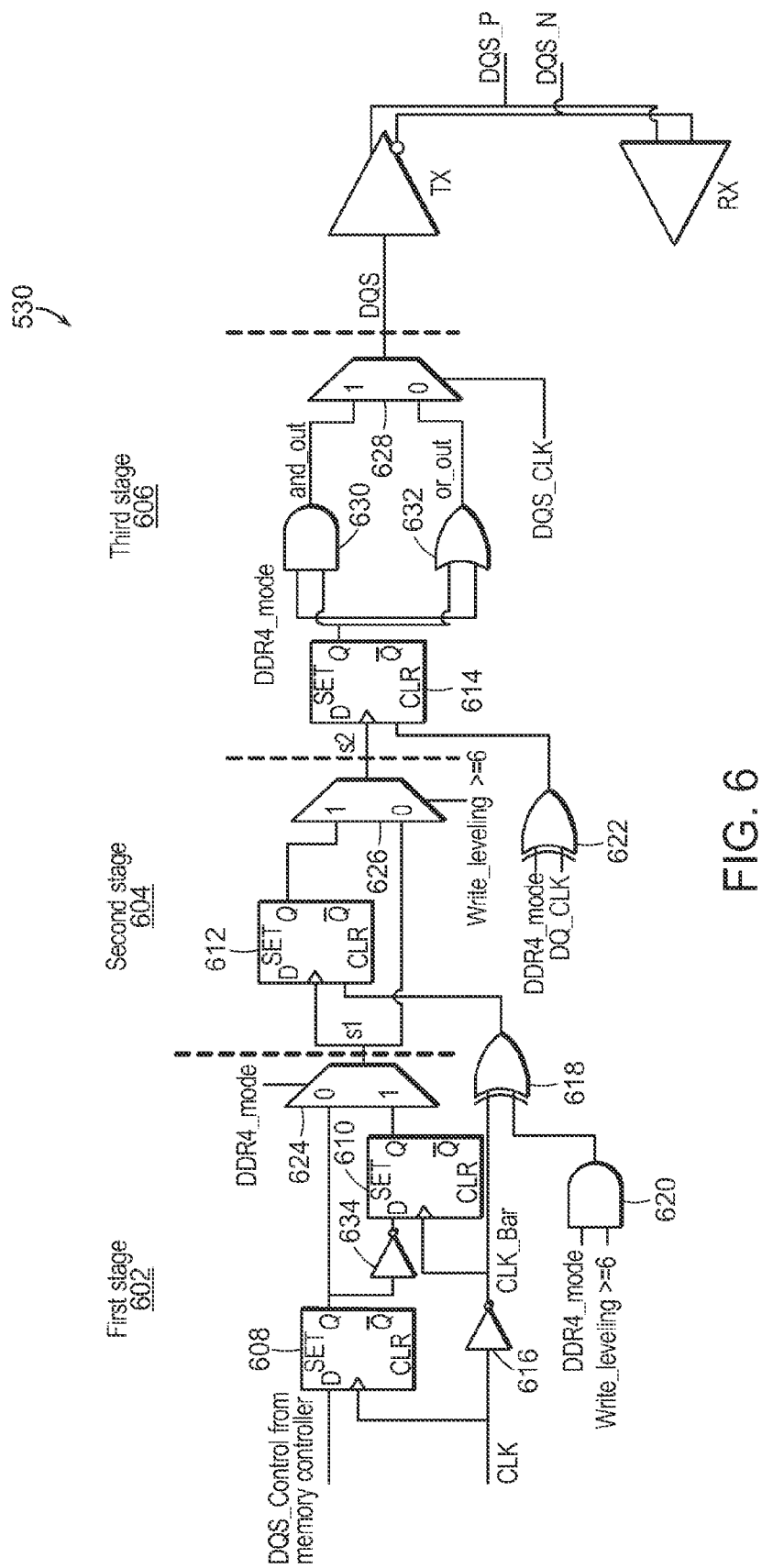
FIG. 6 is a circuit diagram that illustrates an example embodiment of strobe generation circuitry at an I/O interface.

An example embodiment of the strobe generation circuitry 530 is shown in FIG. 6. The circuitry includes three stages. The first stage 602 is responsible for generating either a DDR3 or DDR4 version of DQS_control from the memory controller. The second stage 604 handles the phase shifting or delay required for write leveling. Finally, the third stage 606 handles further timing shift by DQ_CLK, waveform setup for two inputs of multiplexers, and finally DQS generation based on DQS_CLK.

Figure 7:
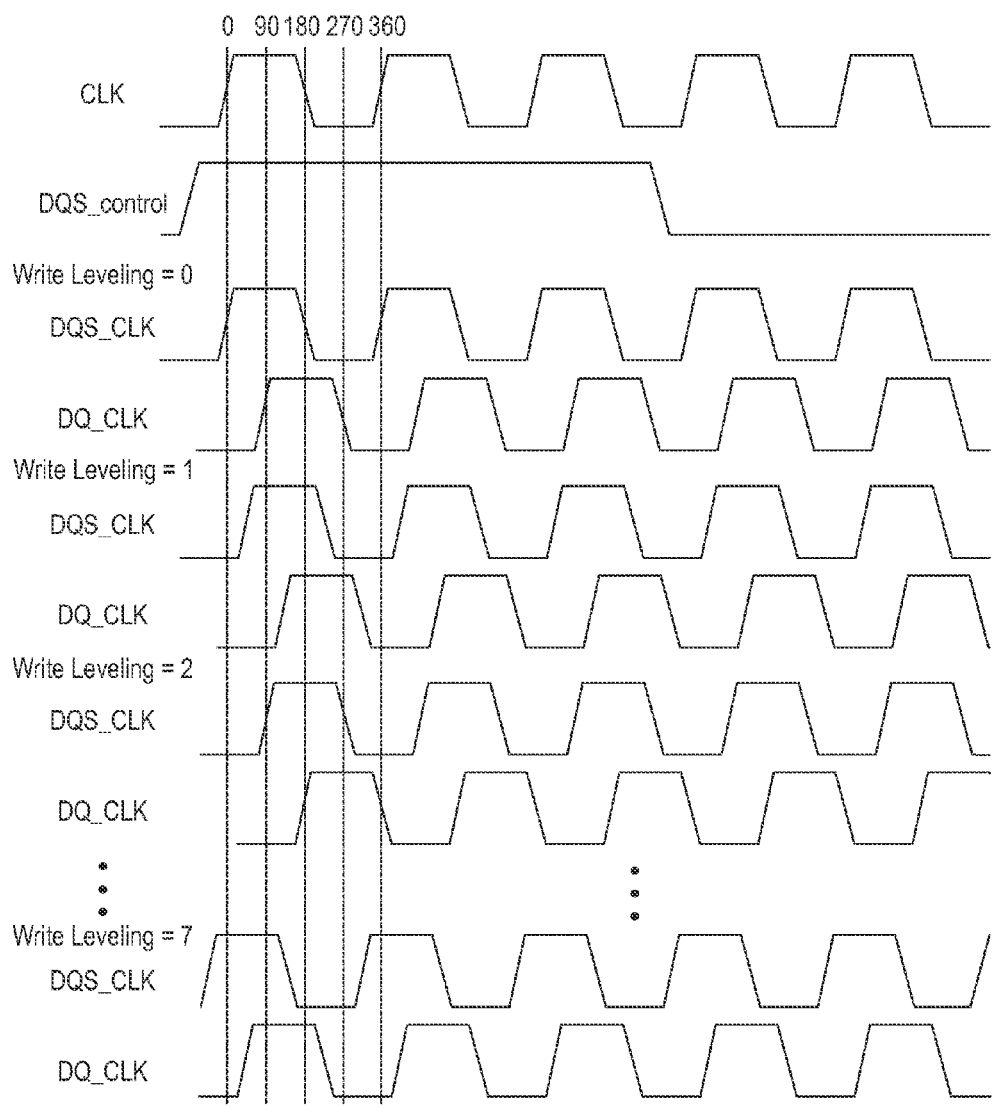
FIG. 7 is a timing diagram that illustrates input waveforms for the circuitry of FIG. 6.

FIG. 7 is a timing diagram that shows waveforms input to the strobe generation circuitry of FIG. 6. CLK is the clock source for the entire memory controller and interface. DQS_control, generated from the memory controller, only needs to be a three-cycle pulse width from the memory controller. This is to produce one cycle of preamble and two cycles of DQS strobe, as required for BL=4 in this example. Importantly, DQS_control does not have to be changed between DDR3 and DDR4 modes.

The specifications for DDR3 and DDR4 provide for write leveling from the memory controller side. Write leveling provides a programmable delay push-out on DQS strobe and DQ data bus during write transactions to compensate for the DQS vs CLK board trace delay that may occur on the system for different byte lanes. A programmable tap delay of 8 is chosen in this example, with each tap delay accounting for 45 degree of phase shift. A "write_leveling>=6" signal in FIG. 6 is asserted high when write leveling is at 6 and above, otherwise, it remains de-asserted at 0. In addition, DQS vs DQ in a given byte group and write leveling setting also require a 90 degree phase shift from each other. To support this requirement, internally DQS_CLK and DQ_CLK are generated as shown in FIG. 7.

Figure 8:
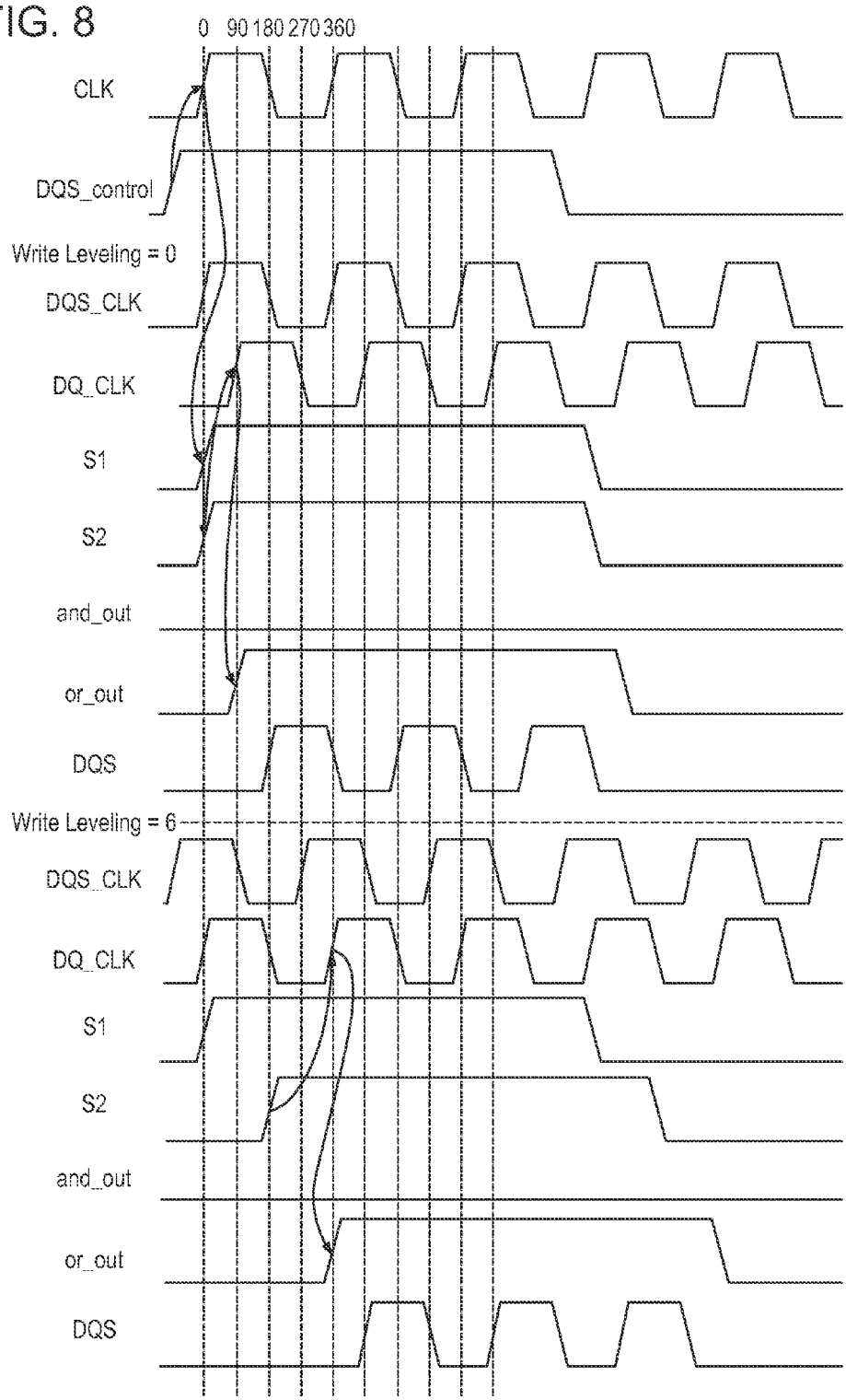
FIG. 8 is a timing diagram that illustrates DDR3 DQS strobes generated by the circuitry of FIG. 6.
Figure 9:
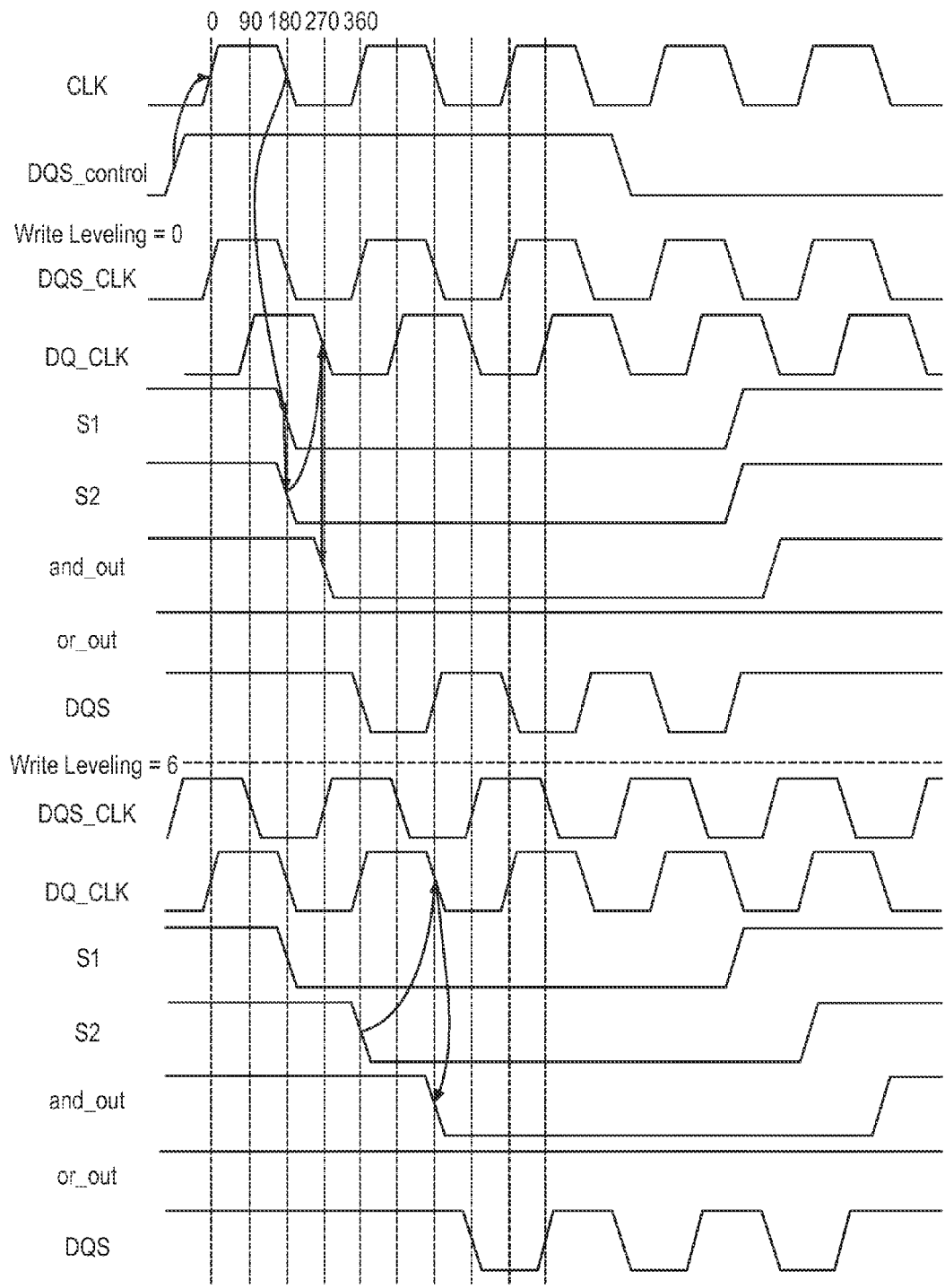
FIG. 9 is a timing diagram that illustrates DDR4 DQS strobes generated by the circuitry of FIG. 6.

With these input waveforms, the strobe generation circuitry can generate either a DDR3 or DDR4 conformed waveform by toggling "ddr4_mode" control. Signals for the circuitry of FIG. 6 are shown in FIGS. 8 and 9 for DDR3 and DDR4, respectively. In particular, signals for write leveling 0 and 6 are shown as examples. Note that the waveform of DQS_control is still the same between DDR3 (ddr4_mode=0) and DDR4 (ddr4_mode=1). Furthermore, DQS_control is also the same for different write leveling settings.

In the case of DDR3, as shown in FIG. 8, node s1 at the first stage 602 is merely a flopped version of the incoming DQS_control (through flop 608 and multiplexer 624 with ddr4_mode=0). At the second stage 604, depending on the write leveling setting, either path is chosen to be forwarded through multiplexer 626 to s2. This is to ensure proper setup and hold time requirements can be met for the flop 614 at the input of the third stage 606, which is clocked by DQ_CLK.

Because DQS_CLK and DQ_CLK will be shifted out by a 45 degrees increment for each setting during write leveling, it is important to generate a signal at s2 which can work with corresponding DQ_CLK at each write leveling shift. When write leveling is 6 and greater, "write leveling>=6" signal is asserted, and the alternative path with flop 612 is used to meet such timing requirement. At the third stage 606, in DDR3 mode, node "and_out" (output of AND gate 630) remains at 0 regardless of different write leveling settings. The node "or_out" (output of OR gate 632) is then generated at the corresponding DQ_CLK at each write leveling.

In the case of DDR4, as shown in FIG. 9, DQS_control is first inverted by inverter 634, and shifted by a half cycle by flop 610 and selected through multiplexer 624 (with ddr4_mode=1) in the first stage 602. Node s1 indicates the output of such change. In the second stage 604, the path when write leveling <6 is the same as previously in DDR3. However, when write leveling >=6, not only is the flop path chosen, but the clock to the flop 612 is also inverted. This is done by having an exclusive-OR logic 618 on the clock path reaching to the flop 612. This is because in DDR4 mode, the preamble is no longer led by a low-to-high transition, as it remains high for a half cycle of time then goes low later. By inverting the clock to the flop 612, the first transition, high-to-low, can be pushed further out by another half cycle. Node s2 in FIG. 9 shows the case for write leveling=0 and write leveling=6. At the third stage 606, also because the first transition in the preamble happens a half cycle later relative to a DDR3 case, the flop 614 is also fed by DQ_CLK being inverted in ddr4_mode by exclusive-OR logic 622. In DDR4, node "or_out" becomes a static 1 instead, and node "and_out" now reflects the output of the flop 614 in the third stage. With these new waveforms for nodes "nor_out" and "and_out" feeding into the final multiplexer 628, a DQS waveform conformed to the DDR4 specification is generated.

It should be understood that the principles described herein for generating different strobe signals for different types of memory components can be applied to other memory components besides the examples shown for DDR3 and DDR4.

While this invention has been particularly shown and described with references to example embodiments thereof, it will be understood by those skilled in the art that various changes in form and details may be made therein without departing from the scope of the invention encompassed by the appended claims.

What is claimed is:

1. A method of generating strobe signals, the method comprising:
    operating a first multiplexer to select between a control signal and the control signal inverted and delayed;
    generating a first strobe signal in a first memory circuit mode by operating a second multiplexer with a clock signal to select between a first input signal and a second input signal, the first input signal having a static first signal level and the second input signal corresponding to the control signal output by the first multiplexer; and
    generating a second strobe signal in a second memory circuit mode by operating the second multiplexer with the clock signal to select between the first input signal and the second input signal, the first input signal corresponding to the control signal inverted and delayed output by the first multiplexer, and the second input signal having a static second signal level.

2. The method of claim 1 wherein the first memory circuit mode corresponds to a DDR3 memory circuit and the second memory circuit mode corresponds to a DDR4 memory circuit.

3. The method of claim 1 further comprising applying write leveling to the control signal prior to generating the first strobe signal in the first memory circuit mode.

4. The method of claim 1 further comprising applying write leveling to the control signal inverted and delayed prior to generating the second strobe signal in the second memory circuit mode.

5. The method of claim 1 wherein the static second signal level is inverted with respect to the static first signal level.

6. A strobe generation circuit comprising:
    a first stage having a multiplexer configured in a first memory circuit mode to select a control signal and configured in a second memory circuit mode to select the control signal inverted and delayed; and
    an other stage coupled to the first stage, the other stage having a multiplexer configured to select in the first memory circuit mode between a first input signal and a second input signal, the first input signal having a static first signal level and the second input signal corresponding to the control signal output by the multiplexer of the first stage, to generate a first strobe signal, the multiplexer configured to select in the second memory circuit mode between the first input signal and the second input signal, the first input signal corresponding to the control signal inverted and delayed output by the multiplexer of the first stage, and the second input signal having a static second signal level, to generate a second strobe signal.

7. The strobe generation circuit of claim 6 wherein the first memory circuit mode corresponds to a DDR3 memory circuit and the second memory circuit mode corresponds to a DDR4 memory circuit.

8. The strobe generation circuit of claim 6 further comprising a second stage coupled between the first stage and the other stage, the second stage configured to apply write leveling to the control signal prior to generating the first strobe signal in the first memory circuit mode and to apply write leveling to the control signal inverted and delayed prior to generating the second strobe signal in the second memory circuit mode.

9. The strobe generation circuit of claim 6 wherein the first stage receives the control signal from a memory controller.

10. The strobe generation circuit of claim 6 coupled between a memory controller and one or more memory components.

11. The strobe generation circuit of claim 6 wherein the static second signal level is inverted with respect to the static first signal level.

12. Apparatus comprising:
    means for operating a multiplexer to select between a control signal and the control signal inverted and delayed;
    means for generating a first strobe signal in a first memory circuit mode configured to select between a first input signal and a second input signal, the first input signal having a static first signal level and the second input signal corresponding to the control signal output by the multiplexer; and
    means for generating a second strobe signal in a second memory circuit mode configured to select between the first input signal and the second input signal, the first input signal corresponding to the control signal inverted and delayed output by the multiplexer, and the second input signal having a static second signal level.

13. The apparatus of claim 12 wherein the first memory circuit mode corresponds to a DDR3 memory circuit and the second memory circuit mode corresponds to a DDR4 memory circuit.

14. The apparatus of claim 12 further comprising means for applying write leveling to the control signal prior to generating the first strobe signal in the first memory circuit mode.

15. The apparatus of claim 12 further comprising means for applying write leveling to the control signal inverted and delayed prior to generating the second strobe signal in the second memory circuit mode.

16. The apparatus of claim 12 wherein the static second signal level is inverted with respect to the static first signal level.

* * * * *